(12) United States Patent
Shimizu et al.

(10) Patent No.: US 12,256,490 B2
(45) Date of Patent: Mar. 18, 2025

(54) PREPREG, LAMINATE, AND PRODUCTION METHODS THEREFOR, AS WELL AS PRINTED CIRCUIT BOARD AND SEMICONDUCTOR PACKAGE

(71) Applicant: HITACHI CHEMICAL COMPANY, LTD., Tokyo (JP)

(72) Inventors: Mari Shimizu, Tokyo (JP); Daisuke Fujimoto, Tokyo (JP); Yasuo Kamigata, Tokyo (JP); Tomohiko Kotake, Tokyo (JP); Shin Takanezawa, Tokyo (JP); Akira Shimizu, Tokyo (JP); Harumi Negishi, Tokyo (JP); Kouichi Aoyagi, Tokyo (JP); Sayaka Kikuchi, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 507 days.

(21) Appl. No.: 16/770,484

(22) PCT Filed: Dec. 10, 2018

(86) PCT No.: PCT/JP2018/045309
§ 371 (c)(1),
(2) Date: Jun. 5, 2020

(87) PCT Pub. No.: WO2019/112066
PCT Pub. Date: Jun. 13, 2019

(65) Prior Publication Data
US 2020/0404783 A1 Dec. 24, 2020

(30) Foreign Application Priority Data
Dec. 8, 2017 (WO) .................. PCT/JP2017/044256

(51) Int. Cl.
*H05K 1/03* (2006.01)
*B29B 15/08* (2006.01)
(Continued)

(52) U.S. Cl.
CPC ........... *H05K 1/0306* (2013.01); *B29B 15/08* (2013.01); *B29B 15/10* (2013.01); *B29B 15/12* (2013.01);
(Continued)

(58) Field of Classification Search
None
See application file for complete search history.

(56) References Cited

U.S. PATENT DOCUMENTS 4,916,000 A * 4/1990 Li .......................... A42B 3/062
428/397
9,074,064 B2 * 7/2015 Ozeki ...................... C08J 5/248
(Continued)

FOREIGN PATENT DOCUMENTS

CN 1082125 A 2/1994
CN 103552170 A 2/2014
(Continued)

OTHER PUBLICATIONS

Kishi, et al., JPH0741575A, Prepreg and Fiber-Reinforced Composite Material, 1993. (English Machine translation included.) (Year: 1993).*

*Primary Examiner* — S. Behrooz Ghorishi
*Assistant Examiner* — Gregory C. Grosso
(74) *Attorney, Agent, or Firm* — FITCH, EVEN, TABIN & FLANNERY, LLP

(57) ABSTRACT

Provided is a prepreg capable of attaining thermal expansion coefficient reduction and elastic modulus increase without increasing the filling ratio of an inorganic filler therein and/or without using a resin having a low thermal expansion (Continued)

coefficient, and thereby capable of reducing warpage thereof. Specifically, provided is a prepreg containing glass fibers and a thermosetting resin composition, and containing a layer of plural glass fiber filaments aligned to run nearly parallel to each other in one direction. Also provided are a production method for the prepreg, a laminate containing the prepreg and its production method, a printed circuit board containing the laminate, and a semiconductor package having a semiconductor device mounted on the printed circuit board.

16 Claims, 3 Drawing Sheets

(51) Int. Cl.
*B29B 15/10* (2006.01)
*B29B 15/12* (2006.01)
*B29B 15/14* (2006.01)
*B29C 70/06* (2006.01)
*C08G 59/40* (2006.01)
*C08J 5/04* (2006.01)
*C08J 5/24* (2006.01)
*H05K 3/46* (2006.01)

(52) U.S. Cl.
CPC .............. *B29B 15/14* (2013.01); *B29C 70/06* (2013.01); *C08G 59/40* (2013.01); *C08J 5/04* (2013.01); *C08J 5/244* (2021.05); *H05K 3/4629* (2013.01)

(56) References Cited

U.S. PATENT DOCUMENTS

| | | | | |
|---|---|---|---|---|
| 2018/0308811 | A1* | 10/2018 | Tsai | H01L 24/96 |
| 2021/0130538 | A1* | 5/2021 | Inadome | C08L 63/00 |

FOREIGN PATENT DOCUMENTS

| | | | | |
|---|---|---|---|---|
| CN | 105538745 | A | * | 5/2016 |
| CN | 107926121 | A | | 4/2018 |
| JP | 48-093698 | A | | 12/1973 |
| JP | 5076340 | A | | 6/1975 |
| JP | 03-166233 | A | | 7/1991 |
| JP | H0741575 | A | * | 2/1995 |
| JP | 09-323380 | A | | 12/1997 |
| JP | 10-508720 | A | | 8/1998 |
| JP | 2003-071836 | A | | 3/2003 |
| JP | 2003-291263 | A | | 10/2003 |
| JP | 2004-182851 | A | | 7/2004 |
| JP | 2004-238615 | A | | 8/2004 |
| JP | 2007-262209 | A | | 10/2007 |
| JP | 2008-110959 | A | | 5/2008 |
| JP | 2010-229238 | A | | 10/2010 |
| JP | 2011-052188 | A | | 3/2011 |
| JP | 2017-125288 | A | | 7/2017 |
| TW | 201638410 | A | | 11/2016 |
| WO | 96/09158 | A1 | | 3/1996 |

* cited by examiner

[Fig. 1]
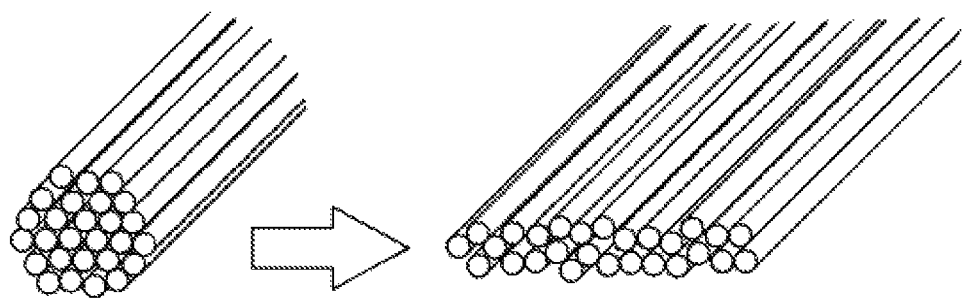
[Fig. 2]
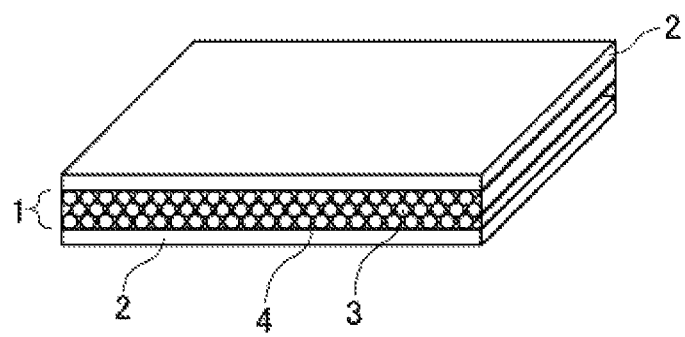
[Fig. 3]
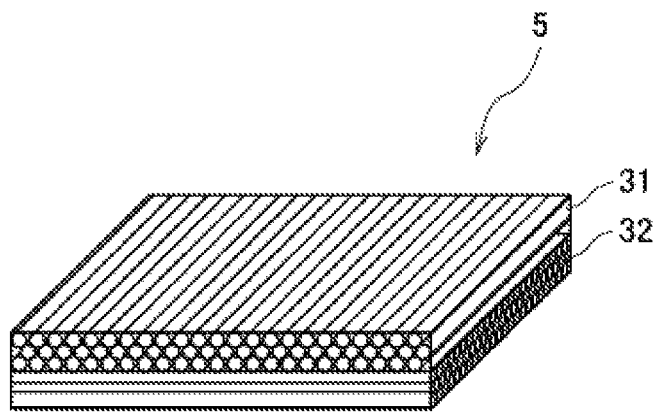

[Fig. 4]
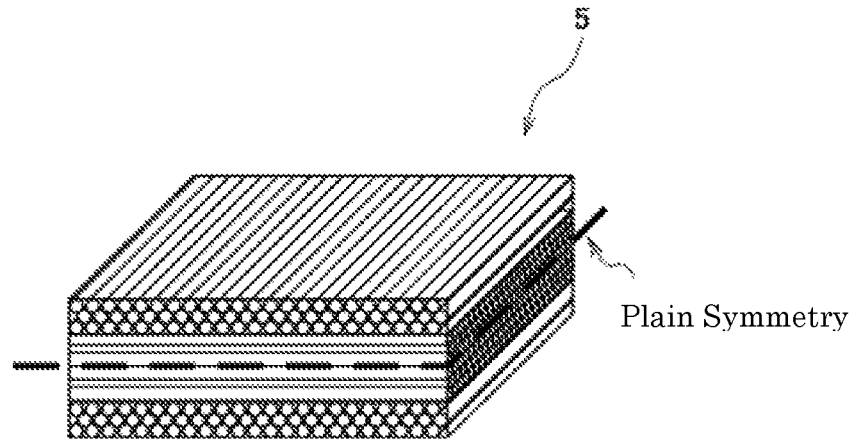
[Fig. 5]
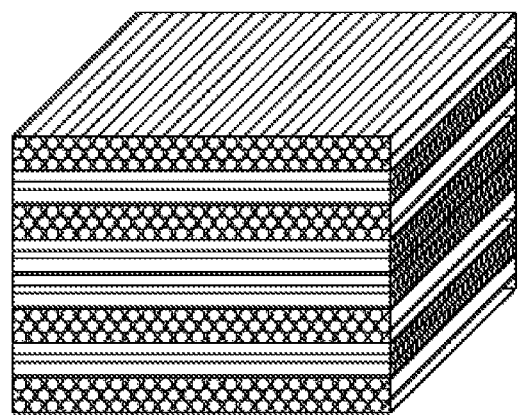
[Fig. 6]
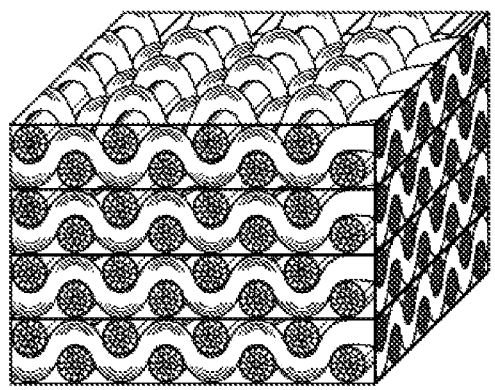

[Fig. 7]
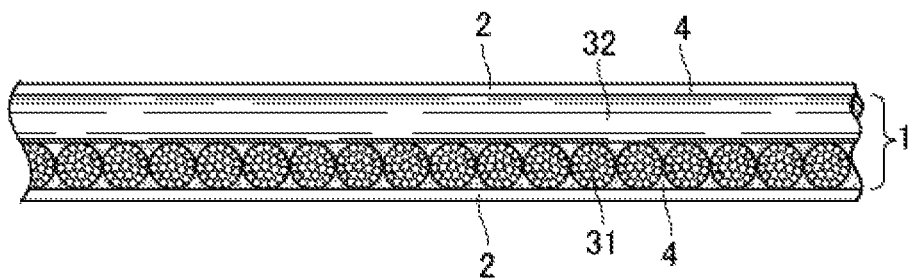
[Fig. 8]
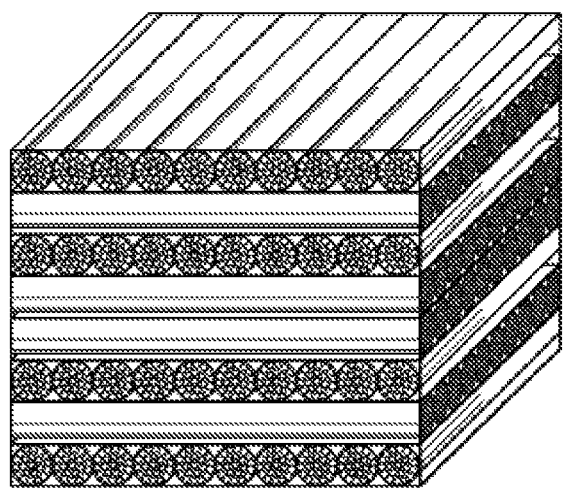

PREPREG, LAMINATE, AND PRODUCTION METHODS THEREFOR, AS WELL AS PRINTED CIRCUIT BOARD AND SEMICONDUCTOR PACKAGE

CROSS-REFERENCE TO RELATED APPLICATIONS

This application is a U.S. national phase application filed under 35 U.S.C. § 371 of International Application No. PCT/JP2018/045309, filed Dec. 10, 2018, designating the United States, which claims priority from International Application No. PCT/JP2017/044256, filed Dec. 8, 2018, which are hereby incorporated herein by reference in their entirety.

TECHNICAL FIELD

The present invention relates to a prepreg, a laminate, and production methods for them, as well as a printed circuit board and a semiconductor package

BACKGROUND ART

Recently, the demand for thinner and lighter electronic instruments has become increasingly greater, and thinning and densification of semiconductor packages and printed wiring boards has been promoted. For stably packaging electronic parts with satisfying the demand for thinning and densification thereof, it is important to prevent the warping to occur in packaging.

In packaging, one reason for the warping to occur in semiconductor packages is the difference in the thermal expansion coefficient between the laminate used in a semiconductor package and the silicon chips to be mounted on the surface of the laminate. Accordingly, for the laminate for semiconductor packages, efforts are made to make the thermal expansion coefficient of the laminate nearer to the thermal expansion coefficient of the silicon chips to be mounted thereon, or that is, to lower the thermal expansion coefficient of the laminate. Another reason is that the elastic modulus of the laminate may have some influence, therefore, it may be effective to increase the elastic modulus of the laminate for reducing the warping of a semiconductor package. Consequently, for reducing the warping of a laminate, it is necessary to lower the expansion coefficient of the laminate and to increase the elastic modulus thereof.

An ordinary plain-woven glass cloth prepreg used for laminates is reinforced, for example, in such a manner that the weft intersects the warp in a woven state (see FIG. 6), and therefore in this, a resin could hardly penetrate into the crossover site. Consequently, the content of the glass fibers in the prepreg is generally at most less than 50% by volume. Accordingly, in such a plain-woven glass cloth prepreg, there are limitations in reducing the thermal expansion coefficient of the glass fibers therein and in increasing the elastic modulus thereof, and consequently, for reducing the thermal expansion coefficient and for increasing the elastic modulus of the prepreg for the purpose of reducing the warpage thereof, increasing the filling rate of an inorganic filler to be therein and/or using a resin having a low thermal expansion coefficient has heretofore been tried (for example, see PTL 1). However, increasing the filling rate of an inorganic filler may cause some problems of reduction in insulation reliability, reduction in adhesiveness between a resin and the wiring layer to be formed on the surface thereof, and press molding failure in production of laminates. On the other hand, as a resin having a low thermal expansion coefficient, there is known a resin having an increased crosslinking density by a cyanate resin or the like to thereby have an increased glass transition temperature (Tg) and have a reduced thermal expansion coefficient, but in such a resin processed to have an increased crosslinking density by a cyanate resin or the like, the molecular chain between the functional groups is short and therefore the resin strength may lower, and to that effect, reduction in thermal expansion is limitative.

In such a situation, warpage reduction by specifically designing the structure of prepreg is tried. In general, a glass fiber prepreg used in laminates is produced by impregnating a glass cloth woven by warp and weft of "glass fiber bundles" formed of a large number of glass fiber filaments, with a thermosetting resin, followed by semicuring the resin. Similarly, as a prepreg using glass fiber bundles, for the purpose of improving dimensional stability, reducing thermal expansion coefficient and improving surface smoothness, there is known a glass fiber prepreg (see FIG. 7) having a glass fiber content of 60% by weight or more and 75% by weight or less and formed of at least two layers of one layer of glass fiber bundles aligned to run in parallel in one direction and another layer of glass fiber bundles aligned to run in the other direction nearly perpendicular to the one direction of the one layer, in which the unit weight of the glass fibers in each layer is 40 g/m$^2$ or less (see PTL 2).

CITATION LIST

Patent Literature

PTL 1: JP 2004-182851 A
PTL 2: JP 5076340 B

SUMMARY OF INVENTION

Technical Problem

The prepreg described in PTL 2 is thinned using glass fiber filaments having a small fiber diameter and reducing the number of glass fiber bundles formed of such filaments therein, and in addition, in the prepreg, the content of glass fibers is relatively high but the upper limit of the content of glass fibers in the prepreg is 75% by weight (59% by volume as converted into a volume ratio), and from the viewpoint of warpage reduction, the prepreg could not be said to be sufficient in point of reduction in thermal expansion and increase in elastic modulus, and further improvement is desired.

The present invention has been made in consideration of such current situations, and its objects are to provide a prepreg capable of attaining thermal expansion coefficient reduction and elastic modulus increase without increasing the filling ratio of an inorganic filler therein and/or without using a resin having a low thermal expansion coefficient, and thereby capable of reducing warpage thereof, to provide a production method for the prepreg, to provide a laminate containing the prepreg and its production method, to provide a printed circuit board containing the laminate, and to provide a semiconductor package having a semiconductor device mounted on the printed circuit board.

Solution to Problem

The present inventors have made assiduous studies for the purpose of solving the above-mentioned problems and, as a result, have found that a prepreg with glass fiber filaments aligned in a predetermined direction can solve the problems, and have achieved the present invention.

The present invention relates to the following [1] to [15].

[1] A prepreg containing glass fibers and a thermosetting resin composition, which contains a layer of plural glass fiber filaments aligned to run nearly parallel to each other in one direction.

[2] The prepreg according to the above [1], which does not contain a glass fiber bundle of 50 or more glass fiber filaments bundled, or which contains such glass fiber bundles, but in which the content thereof is 10% by volume or less relative to the total amount of the glass fibers in the prepreg.

[3] The prepreg according to the above [1] or [2], wherein the content of the glass fibers is 50 to 75% by volume relative to the entire prepreg.

[4] The prepreg according to any of the above [1] to [3], wherein the content of the glass fibers is 60 to 75% by volume relative to the entire prepreg.

[5] The prepreg according to any of the above [1] to [4], wherein the thermosetting resin composition does not contain an inorganic filler, or contains an inorganic filler but the content thereof is 12% by volume or less in the thermosetting resin composition.

[6] The prepreg according to any of the above [1] to [5], having a thickness of 100 μm or less.

[7] A laminate containing the prepreg of any of the above [1] to [6], which contains:
  a layer of plural glass fiber filaments aligned to run nearly parallel to each other in one direction, and a layer of plural glass fiber filaments aligned to run nearly parallel to each other in the other one direction different from the previous one direction.

[8] The laminate according to the above [7], wherein the other one direction different from the previous one direction is another one direction nearly perpendicular to the previous one direction.

[9] The laminate according to the above [7] or [8], which is such that, in the cross section in the thickness direction of the laminate, the upper half and the lower half divided at the center thereof are nearly in plane symmetry.

[10] The laminate according to any of the above [7] to [9], having a bending elastic modulus at 25° C. of 35 GPa or more.

[11] A printed circuit board containing the laminate of any of the above [7] to [10].

[12] A semiconductor package with a semiconductor device mounted on the printed circuit board of the above [11].

[13] A method for producing a prepreg, including the following steps:
  (1) An opening step of opening glass fiber bundles to form plural glass fiber filaments, and
  (2) A step of aligning the plural glass fiber filaments formed in the previous opening step, on a thermosetting resin composition-coated surface of a carrier material so as to make the filaments run nearly parallel to each other in one direction thereon to form a prepreg.

[14] A method for producing a laminate, including the following steps:
  (1) An opening step of opening glass fiber bundles to form plural glass fiber filaments,
  (2) A step of aligning the plural glass fiber filaments formed in the previous opening step, on a thermosetting resin composition-coated surface of a carrier material so as to make the filaments run nearly parallel to each other in one direction thereon to form a prepreg, and
  (3) A step of preparing two or more prepregs formed in the previous step (2), laminating them in such a manner that, in at least one pair of prepregs, the running direction of the plural glass fiber filaments in one prepreg differs from the running direction of the plural glass fiber filaments in the other prepreg, and heating and pressing them.

[15] The method for producing a laminate according to the above [14], wherein the running direction of the plural glass fiber filaments in one prepreg crosses the running direction of the plural glass fiber filaments in the other prepreg nearly perpendicularly to each other.

Advantageous Effects of Invention

According to the present invention, there can be provided a prepreg capable of attaining thermal expansion coefficient reduction and elastic modulus increase without increasing the filling ratio of an inorganic filler therein and/or without using a resin having a low thermal expansion coefficient, and thereby capable of reducing warpage thereof. Further, there can also be provided a production method for the prepreg, a laminate containing the prepreg and its production method, a printed circuit board containing the laminate, and a semiconductor package with a semiconductor device mounted on the printed circuit board.

The prepreg and the laminate of the present invention can be thinned, and can therefore contribute toward thinning a printed circuit board and a semiconductor package.

BRIEF DESCRIPTION OF DRAWINGS

FIG. 1 shows conceptual views of a glass fiber bundle and opened plural glass fiber filaments.

FIG. 2 is a conceptual view showing one embodiment of a prepreg of the present invention.

FIG. 3 is a conceptual view showing one embodiment of a laminate of the present invention.

FIG. 4 is a conceptual view showing another embodiment of a laminate of the present invention.

FIG. 5 is a conceptual view showing another embodiment of a laminate of the present invention.

FIG. 6 is a conceptual view of a plain-woven glass cloth.

FIG. 7 is a conceptual view showing one embodiment of a prepreg described in PTL 2.

FIG. 8 is a conceptual view showing a laminate produced in Comparative Example 2.

DESCRIPTION OF EMBODIMENTS

In the numerical range described in this description, the upper limit or the lower limit of the numerical range may be replaced by the value shown in Examples. The upper limit and the lower limit of one numerical range can be arbitrarily combined with the upper limit or the lower limit, respectively, of the other numerical range.

Unless otherwise specifically indicated, the components and the materials exemplified in this description can be used either singly or as a combination of two or more kinds thereof. Embodiments of a combination of described matters as arbitrarily combined are all included in the present invention.

Hereinunder the present invention is described in detail and as needed with reference to the drawings.

[Prepreg]

The prepreg of the present invention is a prepreg containing glass fibers and a thermosetting resin composition, and is a prepreg that contains a layer of plural glass fiber filaments aligned to run nearly parallel to each other in one direction. Here, in general, a prepreg is one formed by applying a thermosetting resin composition onto a fibrous substrate followed by semicuring it by drying under heat.

In general, the glass fibers for use in a prepreg are glass fiber bundles formed by bundling plural glass fiber filaments with a bundling agent optionally followed by twisting the resultant bundles, and the glass fiber bundle is referred to as a raw yarn, and commercially-available glass fibers are such glass fiber bundles (see the left-side view of FIG. 1). For preventing fluffing by yarn cutting, it is usual to use the glass fiber bundles as they are for production of prepregs, but the prepreg of the present invention uses plural glass fiber filaments prepared by daringly opening the glass fiber bundles (see the right-side view of FIG. 1).

Regarding the prepreg of the present invention, the present inventors' investigations have clarified that the content of the glass fibers in the prepreg and also the content of the glass fibers in the laminate to be mentioned below can be greatly increased. Though an accurate reason for the result is not clear, it may be considered that a glass fiber bundle is bundled with a bundling agent and therefore has a loss corresponding to the volume of the bundling agent and that, as bundled up, the bundle requires a predetermined size and therefore the amount thereof that can be present in a unit area is limited, but it can be presumed that, by aligning glass fiber filaments formed by opening the bundles to run nearly parallel to each other in one direction, these problems can be solved.

In this description, "nearly parallel to each other" is meant to include a completely parallel state and an almost but not completely parallel state. The wording shows a state that can be said to be nearly parallel to each other in whole, and means that even though there may exist some nonparallel parts in detail, "nearly parallel to each other" can include the state so far as it is macroscopically parallel to each other.

(Opening Method)

The opening method is not specifically limited, and any known opening method is employable. For example, an opening method that uses at least one selected from the group consisting of (a) a method of stroking with a round stick, (b) a method of giving vibration, and (c) a method of applying a fluid. For the opening method, not only an opening method for glass fibers but also an opening method for any other fibers such as carbon fibers can also be applied. The above-mentioned methods (a) to (c) can be combined in any arbitrary manner, and any number of the methods can be combined.

(a) As the method of stroking with a round stick, for example, there can be employed a method of introducing fiber bundles between alternately existing upper and lower rolls to make them run therebetween under tension given to the fiber bundles (for example, see JP 60-9961 A).

(b) As the method of giving vibration, for example, there can be employed a method of bringing fiber bundles into contact with a round stick vibrated by ultrasonic waves (for example, see JP 01-282362 A), or a method of opening fiber bundles using a horizontally-vibrating roll that vibrates in the roll axial direction and/or a vertically-vibrating roll that vibrates up and down relative to the running direction of fiber bundles (for example, see JP 2004-225222 A).

(c) As the method of applying a fluid, for example, there can be employed a method of spraying fiber bundles with a fluid such as water, a mixture of water and air, or an organic solvent (for example, see JP 52-151362 A), a method of jetting an air stream toward fiber bundles (for example, see JP 57-77342 A), or an opening method of drawing fiber bundles from plural yarn feeders to feed them to plural fluid running zones, in which the thus-fed fiber bundles are made to run in a vapor stream so as to be opened in the width direction while the fiber bundles are warped by the action of the vapor stream therein, and wherein the traveling fiber bundles are locally bent so as to be alternately repeatedly stretched, loosened, stretched, loosened, . . . for tension variation for opening the fiber bundles (for example, see JP 2007-518890 A). In addition, the opening method described in JP 5553074 B is also employable.

Further, as a combination of the method of giving vibration (b) and the method of applying a fluid (c), there can be employed an opening method of opening continuously running fiber bundles using a horizontally-vibrating roll that vibrates in the width direction of the fiber bundles and/or a vertically-vibrating roll that vibrates in the direction intersecting the running direction of the fiber bundles, wherein a vapor stream is applied to the surface of one side of the running fiber bundles and to the surface of the other side thereof to pulverize and open the fiber bundles (for example, see JP 2005-163223 A).

From the above, in other words, it can be said that the prepreg of the present invention is a prepreg containing glass fibers and a thermosetting resin composition, and containing a layer of glass fibers aligned to run nearly parallel to each other in one direction, in which the glass fibers are formed by opening glass fiber bundles.

The glass fiber bundles may be opened one by one separately, or plural bundles may be opened altogether.

The number of the glass fiber bundles to be used is not specifically limited, but may be, for example, 100 to 15,000 bundles, or may be 100 to 10,000 bundles, or may be 500 to 10,000 bundles, or may be 1,000 to 10,000 bundles, or may be 3,000 to 8,000 bundles.

Also not specifically limited, the opening magnification may be, for example, 1.2 to 5.0 times, or may be 1.5 to 4.0 times, or may be 1.8 to 3.5 times. The opening magnification can be an index that indicates how much the glass fiber bundles are opened.

The temperature in opening is not also specifically limited, and is, in general, preferably 0 to 60° C., more preferably 5 to 45° C., even more preferably 10 to 40° C., and is especially preferably room temperature.

FIG. 2 shows a cross-sectional configuration of a prepreg 1 of one embodiment of the present invention, which is sandwiched between substrates 2. As show in FIG. 2, at the time when the prepreg 1 is produced, a carrier material 2 formed of a polyethylene film, a polyethylene terephthalate film, a release sheet or a copper foil is stuck to both surfaces thereof. In the case where the carrier material 2 is a copper foil, this, as stuck to the prepreg 1, can be a copper foil for circuit formation.

As shown in FIG. 2, the prepreg 1 contains plural glass fiber filaments evenly in one layer, and from the viewpoint of reducing thermal expansion and increasing elastic modulus, preferably, the prepreg does not contain a glass fiber bundle formed of, for example, 50 or more glass fiber filaments, and even when the prepreg contains such a glass fiber bundle, the content thereof is preferably 10% by volume or less relative to the total amount of the glass fibers in the prepreg, more preferably 5% by volume or less, even more preferably 2% by volume or less. In particular, from the viewpoint of reducing thermal expansion and increasing elastic modulus, preferably, the prepreg does not contain a glass fiber bundle of 100 or more bundled filaments, more preferably does not contain a glass fiber bundle of 200 or more bundled filaments, even more preferably does not contain a glass fiber bundles of 500 or more bundled filaments, and even when the prepreg contains such glass fiber bundles, preferably, the content thereof is 10% by volume or less relative to the total amount of the glass fibers in the prepreg, more preferably 5% by volume or less, even more preferably 2% by volume or less.

The fiber size (diameter) of the glass fiber filaments is, from the viewpoint of filling performance, preferably 3 to 50 µm, more preferably 3 to 40 µm, even more preferably 4 to 30 µm, further more preferably 5 to 25 µm, most preferably 5 to 18 µm.

In the prepreg of the present invention, the content of the glass fibers may be 50 to 75% by volume relative to the entire prepreg, or may be 60 to 75% by volume, or may be 65 to 75% by volume. Accordingly, the existence ratio of glass fibers in the prepreg is high to attain reduction in thermal expansion and increase in elastic modulus and therefore attains reduction in warpage. When the content of glass fibers is 75% by volume or less relative to the entire prepreg, the proportion of the thermoplastic resin composition 4 does not lower so much, and therefore the resin composition can be prevented from sufficiently penetrating into the glass fiber filaments 31 and 32 to cause blurring on the surface of the resultant prepreg and laminate. In the case where the prepreg of the present invention contains an inorganic filler, preferably, the total content of the glass fibers and the inorganic filler falls within the above-mentioned range.

Though not specifically limited, the content (ratio by volume) of the glass fibers (and the inorganic filler) in the prepreg can be determined, for example, according to the following method. The mass of the solid content (residue) left in heating the prepreg at 600 to 650° C. is divided by the mass of the prepreg before heating to give a mass ratio A of the inorganic component (that is, the glass fibers and the optionally-contained inorganic filler), and then a mass ratio B of the resin component in the prepreg is derived from the value. From the mass ratio A and the density of the inorganic component, and the mass ratio B and the density of the resin component, the volume of the inorganic component and the volume of the resin component are calculated, and the volume ratio of the inorganic component can be derived from the calculated data.

Since opened glass fiber filaments are used, the thickness of the prepreg can be controlled to be small. The thickness of the prepreg of the present invention can be 100 µm or less, can be 70 µm or less, or can be 50 µm or less. The thickness of the prepreg is preferably 30 to 80 µm, more preferably 35 to 70 µm, even more preferably 35 to 65 µm. Plural sheets of the prepreg can be layered and used.

(Thermosetting Resin Composition)

The prepreg of the present invention is, as mentioned above, a prepreg containing glass fibers and a thermosetting resin composition.

The thermosetting resin composition is not specifically limited, and any known thermosetting resin composition that is used as a prepreg in the field of printed circuit boards can be used.

In the prepreg of the present invention, the thermosetting resin composition does not contain an inorganic filler, or may contain an inorganic filler in an amount of preferably 12% by volume or less, more preferably 8% by volume or less, even more preferably 5% by volume or less, and especially preferably 3% by volume or less. In the present invention, the content of glass fibers in the prepreg can be increased and therefore, even though the prepreg uses a thermosetting resin composition not containing an inorganic filler or containing only a small content of an inorganic filler, the thermal expansion of the prepreg can be reduced and the elastic modulus thereof can be increased.

Components that the thermosetting resin composition can contain are not specifically limited, and examples thereof include (A) a thermosetting resin, (B), a curing accelerator, (C) an inorganic filler and (D) any other additive.

Examples of the thermosetting resin (A) include an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin. Not specifically limited to these, any known thermosetting resin is usable. One alone or two or more kinds of these may be used either singly or as combined.

Examples of the epoxy resin include a bisphenol A-type epoxy resin, a bisphenol F-type epoxy resin, a bisphenol S-type epoxy resin, a phenol-novolak-type epoxy resin, a cresol-novolak-type epoxy resin, an α-naphthol/cresol-novolak-type epoxy resin, a bisphenol A-novolak-type epoxy resin, a bisphenol F-novolak-type epoxy resin, a stilbene-type epoxy resin, a triazine skeleton-containing epoxy resin, a fluorene skeleton-containing epoxy resin, a triphenolmethane-type epoxy resin, biphenyl-type epoxy resin, a xylylene-type epoxy resin, a biphenylaralkyl-type epoxy resin, a naphthalene-type epoxy resin, a dicyclopentadiene-type epoxy resin, an alicyclic epoxy resin, a diglycidyl ether compound of a polycyclic aromatic compound such as polyfunctional phenols and anthracene, and a phosphorus-containing epoxy resin prepared by introducing a phosphorus compound into these.

Examples of the unsaturated imide resin include a maleimide compound having at least two N-substituted maleimide groups in one molecule, and the maleimide compound may be a reaction product with at least one selected from the group consisting of a monoamine compound and a diamine compound.

As the curing accelerator (B), any known curing accelerator may be used depending on the kind of the thermosetting resin (A). For example, a curing accelerator for an epoxy resin include a phosphorus compound; an imidazole compound and a derivative thereof a tertiary amine compound; and a quaternary ammonium compound. One alone or two or more kinds of these may be used either singly or as combined.

The inorganic filler (C) is not specifically limited, and examples thereof include silica, alumina, barium sulfate, talc, mica, kaolin, boehmite, beryllia, barium titanate, potassium titanate, strontium titanate, calcium titanate, aluminum carbonate, magnesium hydroxide, aluminum hydroxide, aluminum borate, aluminum silicate, calcium carbonate, calcium silicate, magnesium silicate, zinc borate, zinc stannate, zinc oxide, titanium oxide, silicon carbonate, silicon nitride, boron nitride, clay such as calcined clay, glass powder and hollow glass beads. One alone or two or more kinds of these may be used either singly or as combined.

The other additive (D) is not specifically limited, and for example, at least one selected from the group consisting of an organic filler, a flame retardant, a thermoplastic resin, a thermoplastic elastomer, a UV absorbent, an antioxidant, a photopolymerization initiator, a fluorescent brightener, and an adhesiveness improver can be used.

The thermosetting resin composition may contain an organic solvent and a dispersant. However, an organic solvent evaporates away in a drying step in producing the prepreg, and therefore, an organic solvent tends not to substantially remain in the prepreg.

[Laminate]

In general, plural prepregs are laminated and pressed under heat to give a laminate for use. In particular, the laminate of the present invention is a laminate containing the prepreg, and is a laminate that contains a layer of plural glass fiber filaments aligned to run nearly parallel to each other in one direction, and a layer of plural glass fiber filaments aligned to run nearly parallel to each other in the other one direction different from the previous one direction.

Here, in the present invention, preferably, the other one direction different from the previous one direction is another one direction nearly perpendicular to the previous one direction. Specifically, the laminate 5 of one embodiment of the present invention in FIG. 3 is formed of one layer in which plural longitudinal glass fiber filaments 31 are aligned to run nearly parallel to each other in the back and forth direction of the plane of paper, and another one layer in which lateral glass fiber filaments 32 are aligned to run nearly parallel to each other in the direction nearly perpendicular to the longitudinal glass fiber filaments 31, and this is one preferred embodiment of the present invention. Around the glass fiber filaments, a thermosetting resin composition 4 exists. Here, "nearly perpendicular to" is meant to include a completely perpendicular state and an almost but not completely perpendicular state. The wording shows a state that can be said to be nearly perpendicular in whole, and means that even though there may exist some non-perpendicular parts in detail, "nearly perpendicular" can include the state so far as it is macroscopically perpendicular.

The layer containing the glass fiber filaments 31 and the layer containing the glass fiber filaments 32 are almost the same in point of the fiber diameter and the length of each glass fiber filaments and the glass fiber content, except that they differ in point of the direction of the glass fiber filaments, that is, the volume ratio of the glass fibers is the same between the two, and accordingly, the vertical and horizontal dimensional change of the laminate 5 is almost the same.

Preferably, in the cross section in the thickness direction of the laminate of the present invention, the upper half and the lower half divided at the center thereof are nearly in plane symmetry. Having such an embodiment, the laminate can effectively reduce warpage. Here, the wording "nearly in plane symmetry" does not require symmetry paying attention to even each one glass fiber filament, but means that the upper half and the lower half divided at the center are nearly in plane symmetry, paying attention to the alignment direction of glass fiber filaments. For example, in the laminate of FIG. 4, the upper half and the lower half divide at the center shown in the drawing are in plane symmetry, which is favorable from the viewpoint of warpage reduction. Also in the laminate of FIG. 5, the upper half and the lower half divide at the center shown are in plane symmetry, which is therefore favorable from the viewpoint of warpage reduction.

In the laminate of the present invention, the content of the glass fibers may be 50 to 75% by volume relative to the entire laminate (but in the case of a laminate having a metal foil, the metal foil is excluded), or may be 55 to 75% by volume, or may be 60 to 75% by volume, or may be 65 to 75% by volume. In the case where the laminate of the present invention contains an inorganic filler, preferably, the total content of the glass fibers and the inorganic filler falls within the above-mentioned range.

The laminate of the present invention includes a structure that can increase the content of glass fibers, and accordingly, the elastic modulus in bending thereof at 25° C. can be 35 GPa or more. Depending on the content of glass fibers, the elastic modulus can be 40 GPa or more, or 44 GPa or more, or 47 GPa or more. The upper limit of the elastic modulus in bending at 25° C. is not specifically limited, and is generally 55 GPa or less, and may be 50 GPa or less.

The elastic modulus in bending is a value measured according to the method described in the section of Examples.

[Method for Producing Prepreg]

The present invention also provides a method for producing a prepreg, including the following steps:
(1) An opening step of opening glass fiber bundles to form plural glass fiber filaments, and
(2) A step of aligning the plural glass fiber filaments formed in the previous opening step, on a thermosetting resin composition-coated surface of a carrier material so as to make the filaments run nearly parallel to each other in one direction thereon to form a prepreg [hereinafter may be referred to as a step (2)].

In the opening step, glass fiber bundles are opened to form plural glass fiber filaments. As described above, the opening method is not specifically limited, and, for example, the above-mentioned opening method can be employed.

In the step (2), the method of aligning plural glass fiber filaments on a thermosetting resin composition-coated surface of a carrier material so as to make the filaments run nearly parallel to each other in one direction thereon is not specifically limited, and the plural glass fiber filaments prepared in the previous opening step may be aligned on the surface of the carrier material as they are thereon, or the plural glass fiber filaments prepared in the opening step may be once wound up around a roll, then optionally cut, and thereafter the thus-cut filaments may be aligned on the surface of the carrier material.

[Method for Producing Laminate]

The present invention also provides a method for producing a laminate that includes the following steps.
(1) An opening step of opening glass fiber bundles to form plural glass fiber filaments,
(2) A step of aligning the plural glass fiber filaments formed in the previous opening step, on a thermosetting resin composition-coated surface of a carrier material so as to make the filaments run nearly parallel to each other in one direction thereon to form a prepreg [Step (2)], and
(3) A step of preparing two or more prepregs formed in the previous step (2), laminating them in such a manner that, in at least one pair of prepregs, the running direction of the plural glass fiber filaments in one prepreg differs from the running direction of the plural glass fiber filaments in the other prepreg, and heating and pressing them [hereinafter may be referred to as a step (3)].

The opening step and the step (2) are the same as those described for the prepreg production method.

In the step (3), preferably, the running direction of the plural glass fiber filaments on one prepreg is nearly perpendicular to the running direction of the plural glass fiber filaments in the other prepreg. For example, two prepregs formed in the previous step (2) may be laminated in different directions to attain this embodiment.

In the step (3), for the heating and pressing condition, the condition in producing ordinary laminates may be employed. For example, a multistage press, a multistage vacuum press, a continuous molding machine or an autoclave molding machine may be used, and the laminate may be produced under the condition of a temperature of 100 to 260° C., a pressure of 0.2 to 10 MPa, and a heating time of 0.1 to 5 hours.

[Printed Circuit Board]

The present invention provides also a printed circuit board containing the above-mentioned laminate. More specifically, plural sheets of the prepreg of the present invention are prepared, one surface or both surfaces thereof are cladded with a metal foil of copper, aluminum or the like, and these prepregs are laminated and molded to produce a metal-clad laminate, and then a wiring pattern is formed on the metal foil to produce a printed circuit board. Not specifically limited, the metal foil may be any one usable for electrical insulation materials but is preferably a copper foil. The method for forming a wiring pattern is not also specifically limited, and any known process such as a subtractive process, a full-additive process, a semi-additive process (SAP) or a modified semi-additive process (m-SAP) is employable.

[Semiconductor Package]

The present invention provides also a semiconductor package with a semiconductor device mounted on the above-mentioned printed circuit board. The semiconductor package can be produced by arranging a semiconductor device such as a semiconductor chip or a memory at a predetermined position of the printed circuit board, followed by sealing up the semiconductor device with a sealant resin or the like.

EXAMPLES

Next, the present invention is described in more detail with reference to the following Examples, but these Examples do not restrict the present invention.

The physical properties and the characteristics of the laminates produced in the following Examples were measured and evaluated according to the methods mentioned below.

(1) Measurement of Bending Elastic Modulus

A sample piece of 40 mm×25 mm was cut out of the laminate produced in Examples, and using a 5-tone Tensilon from Orientec Corporation, the bending elastic modulus thereof (GPa) was measured at 25° C., at a cross head speed of 1 mm/min, and at a span distance of 20 mm.

(2) Evaluation of Blurring

The laminate produced in Examples was visually checked and evaluated according to the following evaluation criteria.
A: No blurring.
B: A little blurring.
C: Much blurring.

(3) Measurement of Warpage

The laminate produced in Example was cladded with a copper foil to produce a copper-clad laminate for evaluation. A test piece of 40×40 mm was cut out of the laminate for evaluation, and a semiconductor silicon substrate of 20×20 mm was bonded to the laminate to prepare a test laminate.

The warpage of the test laminate was measured using a shadow moire device (Thermolay PS-200, from AKROMETRIX Corporation). Regarding the measurement condition, the sample was heated from 25° C. up to 260° C., then cooled down to 25° C., and the warpage of the sample was measured. The warpage in Comparative Example 1 was taken as a standard (100), and the value in each Example was calculated.

Production Example 1 (Production of Thermosetting Resin Composition 1)

"NC-3000H" (trade name, from Nippon Kayaku Co., Ltd.) as an epoxy resin, an addition reaction product of a bismaleimide compound and a diamine compound as a maleimide resin, "G-8009L" (trade name, isocyanate-masked imidazole, from DKS Co., Ltd.) as a curing accelerator, and "Yoshinox BB" (trade name, 4,4'-butylidenebis-(6-t-butyl-3-methylphenol), from Mitsubishi Chemical Corporation) as an antioxidant were mixed in a mixed solvent of methyl ethyl ketone and cyclohexanone to prepare a thermosetting resin composition 1 having a solid concentration of 55% by mass.

Example 1

A polyethylene terephthalate film having a thickness of 38 μm was used as a carrier material, the thermosetting resin composition 1 prepared in Production Example 1 was applied to the carrier material in a thickness of 12 μm thereon to produce a 12 μm-thick resin-coated film 1.

Next, glass fiber bundles each produced by bundling 6,000 glass fiber filaments each having a fiber size (diameter) of 12 μm were opened to an opening magnification of 3.2 times, and the resultant, opened glass fiber filaments were aligned horizontally to a width of 300 mm on the 12 μm-thick resin-coated film 1. On this, another one 12 μm-thick resin-coated film 1 was put and stuck thereto in such a manner that the resin-coated surface could face downward.

The resultant prepreg precursor was B-staged using a hot roller under a pressure of 1 MPa, at a temperature of 150° C. and a feeding speed of 1 m/min to give a prepreg having a glass fiber content of 50% by volume.

8 prepregs produced in the above were laminated in the manner as shown in FIG. 5, and pressed under heat using a vacuum press under the condition of heating it at a heating rate of 3° C./min and keeping it at 245° C. for 85 minutes under a pressure of 2 MPa to produce a laminate.

The resultant laminate was evaluated according to the above-mentioned methods. The results are shown in Table 1.

Example 2

A prepreg having a glass fiber content of 60% by volume was produced in the same manner as in Example 1, except that the thermosetting resin composition 1 prepared in Production Example 1 was applied to the carrier material to a thickness of 10 μm to produce a 10 μm-thick resin coated film 2, and this was used in place of the resin-coated film 1, and that the glass fiber bundles were opened to an opening magnification of 2.6 times. Using the prepreg, a laminate was produced in the same manner as in Example 1.

The resultant laminate was evaluated according to the above-mentioned methods. The results are shown in Table 1.

Example 3

A prepreg having a glass fiber content of 70% by volume was produced in the same manner as in Example 1, except that the thermosetting resin composition 1 prepared in Production Example 1 was applied to the carrier material to a thickness of 7 μm to produce a 7 μm-thick resin coated film 3, and this was used in place of the resin-coated film 1, and that the glass fiber bundles were opened to an opening magnification of 2.0 times. Using the prepreg, a laminate was produced in the same manner as in Example 1.

The resultant laminate was evaluated according to the above-mentioned methods. The results are shown in Table 1.

Comparative Example 1

As glass fibers, a plain-woven glass cloth (100 g/m$^2$) was used, and this was coated by immersion with the thermosetting resin composition 1 prepared in Production Example 1, and then dried by heating at 110° C. for 3 minutes to produce a prepreg having a glass fiber content of 45% by volume. Using the prepreg, a laminate was produced in the same manner as in Example 1.

The resultant laminate was evaluated according to the above-mentioned methods. The results are shown in Table 1. In Table 1, the warpage of the laminate produced in Comparative Example 1 was taken as a standard reference (100).

Comparative Example 2

According to the method described in PTL 2, glass fiber bundles formed by bundling 200 glass fiber filaments each having a fiber size (diameter) of 5 μm were, as they were not opened, aligned on a resin-coated film 4 having a thickness of 10.5 μm that had been coated with the thermosetting resin composition 1, at a pitch of 0.5 mm. On this, the resin-coated film 4 having a thickness of 10.5 μm was put and stuck thereto in such a manner that the resin-coated surface could face downward to produce a prepreg containing glass fiber bundles in a threshold limit content at which blurring would begin to occur.

This was B-staged using a hot roller under a pressure of 1 MPa, at a temperature of 150° C. and a feeding speed of 1 m/min to give a prepreg having a glass fiber content of 59% by volume.

8 prepregs produced in the above were laminated in the manner as shown in FIG. 8, and pressed under heat using a vacuum press under the condition of heating it at a heating rate of 3° C./min and keeping it at 245° C. for 85 minutes under a pressure of 2 MPa to produce a laminate.

The resultant laminate was evaluated according to the above-mentioned methods. The results are shown in Table 1.

elastic, the warpage thereof was reduced, and they were free from blurring.

On the other hand, in Comparative Example 1 using a plain-woven glass fabric, the glass fiber content could be at most 45% by volume and the thermal expansion coefficient could not be reduced and, in addition, the bending elastic modulus was low, and reducing the warpage occurred in this was problematic. Further, as in Comparative Example 2, the prepreg produced according to the method described in PTL 2 had much blurring though blurring was tried to be minimized in producing this, and in addition, the glass fiber content in this could be increased only up to at most 59% by volume, and reducing the thermal expansion coefficient of the prepreg was limited, the bending elastic modulus of the prepreg was 35 GPa, and it should be said that there is room for the effect of reducing warpage.

Next, changing the kind of the thermosetting resin composition, the same experiments were carried out.

Production Example 2 (Production of Thermosetting Resin Composition 2; Resin Composition for Introducing 5% by Volume of Inorganic Filler into Prepreg)

"NC-7000L" (trade name, from Nippon Kayaku Co., Ltd.) as an epoxy resin, an addition reaction product of a bismaleimide compound and a diamine compound as a maleimide resin, "G-8009L" (trade name, isocyanate-masked imidazole, from DKS Co., Ltd.) as a curing accelerator, molten spherical silica (trade name, average particle size 0.5 μm, from Admatechs Company Limited) as an inorganic filler and "Yoshinox BB" (trade name, 4,4'-butylidenebis-(6-t-butyl-3-methylphenol), from Mitsubishi Chemical Corporation) as an antioxidant were mixed in a mixed solvent of methyl ethyl ketone and cyclohexanone to prepare a thermosetting resin composition 2 having a solid concentration of 55% by mass.

Production Example 3 (Production of Thermosetting Resin Composition 3; Resin Composition for Introducing 10% by Volume of Inorganic Filler into Prepreg)

"NC-7000L" (trade name, from Nippon Kayaku Co., Ltd.) as an epoxy resin, an addition reaction product of a

TABLE 1

| | | Example | | | Comparative Example | |
|---|---|---|---|---|---|---|
| | | 1 | 2 | 3 | 1 | 2 |
| Glass Fibers | | opened | opened | opened | glass cloth | unopened |
| Glass Fiber Content in Prepreg (% by volume) | | 50 | 60 | 70 | 45 | 59 |
| Thermosetting Resin Composition No. | | 1 | 1 | 1 | 1 | 1 |
| Structure of Laminate | | FIG. 5 | FIG. 5 | FIG. 5 | FIG. 6 | FIG. 8 |
| Evaluation Results | Bending Elastic Modulus (GPa) | 37 | 45 | 48 | 25 | 35 |
| | Blurring | A | A | A | A | C |
| | Warpage | 88 | 95 | 95 | 100 | — |

As in Table 1, in Examples 1 to 3, the glass fiber content in the prepreg and the laminate could be increased and the thermal expansion coefficient thereof could be reduced, and in addition, the prepreg and the laminate produced therein had an increased bending elastic modulus and were highly bismaleimide compound and a diamine compound as a maleimide resin, "G-8009L" (trade name, isocyanate-masked imidazole, from DKS Co., Ltd.) as a curing accelerator, molten spherical silica (trade name, average particle size 0.5 μm, from Admatechs Company Limited) as an inorganic filler and "Yoshinox BB" (trade name, 4,4'-butylidenebis-(6-t-butyl-3-methylphenol), from Mitsubishi Chemical Corporation) as an antioxidant were mixed in a mixed solvent of methyl ethyl ketone and cyclohexanone to prepare a thermosetting resin composition 3 having a solid concentration of 55% by mass.

Production Example 4 (Production of Thermosetting Resin Composition 4; Resin Composition for Introducing 25% by Volume of Inorganic Filler into Prepreg)

"NC-7000L" (trade name, from Nippon Kayaku Co., Ltd.) as an epoxy resin, an addition reaction product of a bismaleimide compound and a diamine compound as a maleimide resin, "G-8009L" (trade name, isocyanate-masked imidazole, from DKS Co., Ltd.) as a curing accelerator, molten spherical silica (trade name, average particle size 0.5 μm, from Admatechs Company Limited) as an inorganic filler and "Yoshinox BB" (trade name, 4,4'-butylidenebis-(6-t-butyl-3-methylphenol), from Mitsubishi Chemical Corporation) as an antioxidant were mixed in a mixed solvent of methyl ethyl ketone and cyclohexanone to prepare a thermosetting resin composition 4 having a solid concentration of 55% by mass.

Example 4

A polyethylene terephthalate film having a thickness of 38 μm was used as a carrier material, the thermosetting resin composition 2 prepared in Production Example 2 was applied to the carrier material in a thickness of 10 μm thereon to produce a 10 μm-thick resin-coated film 2.

Next, glass fiber bundles each produced by bundling 6000 glass fiber filaments each having a fiber size (diameter) of 12 μm were opened to an opening magnification of 2.6 times, and the resultant, opened glass fiber filaments were aligned horizontally to a width of 300 mm on the 10 μm-thick resin-coated film 2. On this, another one 10 μm-thick resin-coated film 2 was put and stuck thereto in such a manner that the resin-coated surface could face downward.

The resultant prepreg precursor was B-staged using a hot roller under a pressure of 1 MPa, at a temperature of 150° C. and a feeding speed of 1 m/min to give a prepreg having a glass fiber content of 60% by volume (having a total content of glass fibers and inorganic filler of 65% by volume).

8 prepregs produced in the above were laminated in the manner as shown in FIG. 5, and pressed under heat using a vacuum press under the condition of heating it at a heating rate of 3° C./min and keeping it at 245° C. for 85 minutes under a pressure of 2 MPa to produce a laminate.

The resultant laminate was evaluated according to the above-mentioned methods. The results are shown in Table 2.

Example 5

A prepreg having a glass fiber content of 60% by volume (70% by volume of a total contact of glass fibers and inorganic filler) was produced in the same manner as in Example 4, except that the thermosetting resin composition 3 prepared in Production Example 3 was applied to the carrier material to a thickness of 10 μm to produce a 10 μm-thick resin coated film 3, and this was used in place of the resin-coated film 2. Using the prepreg, a laminate was produced in the same manner as in Example 4.

The resultant laminate was evaluated according to the above-mentioned methods. The results are shown in Table 2.

Comparative Example 3

As glass fibers, a plain-woven glass cloth (100 g/m$^2$) was used, and this was coated by immersion with the thermosetting resin composition 4 prepared in Production Example 4 in place of the thermosetting resin composition 3, and then dried by heating at 110° C. for 3 minutes to produce a prepreg having a glass fiber content of 45% by volume (having a total content of glass fibers and inorganic filler of 70% by volume).

The total content of the glass fibers and the inorganic filler in the laminate was 70% by volume, and was the same as the total content of the glass fibers and the inorganic filler in the laminate produced in Example 5, but the laminate produced herein warped (in Table 2, the warpage of the laminate of Comparative Example 3 was taken as a reference standard (100)), and reducing the warpage is the subject matter of the present invention.

The resultant laminate was evaluated according to the above-mentioned methods. The results are shown in Table 2.

Comparative Example 4

In the same manner as in Comparative Example 3 except that the coating amount of the thermosetting resin composition 4 was reduced, a prepreg having a glass fiber content of 60% by volume (having a total content of glass fibers and inorganic filler of 85% by volume) was produced, and a laminate was produced also in the same manner as in Comparative Example 3.

Reducing warpage of the laminate was tried by increasing the total content of the glass fibers and the inorganic filler in the laminate over that in Comparative Example 3 (70% by volume), and thereby reducing the thermal expansion coefficient thereof, but the surface of the laminate had much blurring.

TABLE 2

|  | Example | | Comparative Example | |
| --- | --- | --- | --- | --- |
|  | 4 | 5 | 3 | 4 |
| Glass Fibers | opened | opened | glass cloth | glass cloth |
| Structure of Laminate | FIG. 5 | FIG. 5 | FIG. 6 | FIG. 6 |
| Inorganic Filler Content in Prepreg (% by volume) | 5 | 10 | 25 | 25 |
| Glass Fiber Content in Prepreg (% by volume) | 60 | 60 | 45 | 60 |
| Total Content of Inorganic Filler and Glass Fibers (% by volume) | 65 | 70 | 70 | 85 |

TABLE 2-continued

|  |  | Example | | Comparative Example | |
|---|---|---|---|---|---|
|  |  | 4 | 5 | 3 | 4 |
| Thermosetting Resin Composition No. | | 2 | 3 | 4 | 4 |
| Evaluation Results | Bending Elastic Modulus (GPa) | 42 | 43 | 25 | — |
|  | Blurring | A | A | A | C |
|  | Warpage | 85 | 95 | 100 | — |

As in Table 2, in Examples 4 to 5, the glass fiber content in the prepreg and the laminate could be increased and the thermal expansion coefficient thereof could be reduced, and in addition, the prepreg and the laminate produced therein had an increased bending elastic modulus and were highly elastic, the warpage thereof was reduced, and they were free from blurring.

On the other hand, in Comparative Example 3 using a plain-woven glass fabric, the glass fiber content could be at most 45% by volume and the thermal expansion coefficient could not be reduced and, in addition, reducing the warpage occurred in this was problematic. Moreover, the bending elastic modulus in this also lowered. In Comparative Example 4, the glass fiber content was increased so as to reduce warpage having occurred in Comparative Example 3, but the surface of the laminate had much blurring.

INDUSTRIAL APPLICABILITY

The prepreg and the laminate of the present invention satisfy both reduction in thermal expansion and increase in elastic modulus, and the warpage thereof is reduced, and therefore the prepreg and the laminate are useful for printed circuit boards for electronic instruments.

REFERENCE SIGNS LIST

1 Prepreg
2 Carrier Material
3 Glass Fiber Filaments
4 Thermosetting Resin Composition
5 Laminate
31 Longitudinal Glass Fiber Filaments
32 Lateral Glass Fiber Filaments

The invention claimed is:

1. A prepreg for forming a laminate used in a semiconductor package, the prepreg comprising glass fibers and a thermosetting resin composition, which contains a layer of plural glass fiber filaments aligned to run nearly parallel to each other in one direction,
wherein the prepreg does not contain a glass fiber bundle of 50 or more glass fiber filaments bundled, or contains such glass fiber bundles, but the content thereof is 10% by volume or less relative to the total amount of the glass fibers in the prepreg, and
wherein the prepreg has a property that, when a plurality of the prepregs are provided in layers in a laminate that contains a layer of plural glass fiber filaments aligned to run nearly parallel to each other in one direction, and a layer of plural glass fiber filaments aligned to run nearly parallel to each other in the other one direction different from the previous one direction, the laminate has a bending elastic modulus at 25° C. of 35 GPa or more.

2. The prepreg according to claim 1, wherein the content of the glass fibers is 60 to 75% by volume relative to the entire prepreg.

3. The prepreg according to claim 1, having a thickness of 100 μm or less.

4. The prepreg according to claim 1, wherein the prepreg does not contain a glass fiber bundle of 50 or more glass fiber filaments bundled, or contains such glass fiber bundles, but in which the content thereof is 5% by volume or less relative to the total amount of the glass fibers in the prepreg.

5. The prepreg according to claim 1, wherein the prepreg does not contain a glass fiber bundle of 50 or more glass fiber filaments bundled, or contains such glass fiber bundles, but in which the content thereof is 2% by volume or less relative to the total amount of the glass fibers in the prepreg.

6. The prepreg according to claim 1, wherein the prepreg does not contain a glass fiber bundle of 100 or more glass fiber filaments bundled.

7. The prepreg according to claim 1, wherein the prepreg does not contain a glass fiber bundle of 50 or more glass fiber filaments bundled.

8. The prepreg according to claim 1, wherein the plural glass fiber filaments are glass fiber filaments prepared by opening glass fiber bundles.

9. The prepreg according to claim 1, wherein the content of the glass fibers is 50 to 75% by volume relative to the entire prepreg.

10. The prepreg according to claim 9, wherein the thermosetting resin composition does not contain an inorganic filler, or contains an inorganic filler but the content thereof is 12% by volume or less in the thermosetting resin composition.

11. The prepreg according to claim 1, wherein the thermosetting resin composition does not contain an inorganic filler, or contains an inorganic filler but the content thereof is 12% by volume or less in the thermosetting resin composition, and the thermosetting resin composition does not contain a thermoplastic elastomer.

12. A laminate comprising the prepreg of claim 1, which contains:
a layer of plural glass fiber filaments aligned to run nearly parallel to each other in one direction, and a layer of plural glass fiber filaments aligned to run nearly parallel to each other in the other one direction different from the previous one direction.

13. The laminate according to claim 12, wherein the other one direction different from the previous one direction is another one direction nearly perpendicular to the previous one direction.

14. The laminate according to claim 12, which is such that, in the cross section in the thickness direction of the laminate, the upper half and the lower half divided at the center thereof are nearly in plane symmetry.

15. A printed circuit board comprising the laminate of claim 1.

16. A semiconductor package with a semiconductor device mounted on the printed circuit board of claim 15.

* * * * *